(12) United States Patent
Hasegawa et al.

(10) Patent No.: US 10,882,318 B2
(45) Date of Patent: Jan. 5, 2021

(54) METHOD OF MANUFACTURING SEMICONDUCTOR SUBSTRATE AND METHOD OF MANUFACTURING SUBSTRATE FOR LIQUID EJECTION HEAD

(71) Applicant: CANON KABUSHIKI KAISHA, Tokyo (JP)

(72) Inventors: Kouji Hasegawa, Kawasaki (JP); Koji Sasaki, Nagareyama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/269,809

(22) Filed: Feb. 7, 2019

(65) Prior Publication Data
US 2019/0263123 A1     Aug. 29, 2019

(30) Foreign Application Priority Data
Feb. 28, 2018 (JP) ................. 2018-034970

(51) Int. Cl.
*H01L 27/02* (2006.01)
*B41J 2/16* (2006.01)
(Continued)

(52) U.S. Cl.
CPC ............ *B41J 2/1628* (2013.01); *B41J 2/162* (2013.01); *B41J 2/1603* (2013.01); *B41J 2/1629* (2013.01); *B41J 2/1631* (2013.01); *B41J 2/1639* (2013.01); *B41J 2/1642* (2013.01); *B41J 2/1645* (2013.01); *H01L 21/2855* (2013.01); *H01L 21/32134* (2013.01); *H01L 21/32135* (2013.01); *H01L 21/32139* (2013.01)

(58) Field of Classification Search
CPC ...... B41J 2/1631; B41J 2/1629; B41J 2/1639; B41J 2/1628
See application file for complete search history.

(56) References Cited

U.S. PATENT DOCUMENTS 6,838,351 B2 *  1/2005  Sasaki ............... H01C 17/065
                                                    361/766
6,960,529 B1    11/2005  Nelson et al.
(Continued)

FOREIGN PATENT DOCUMENTS

JP     2005-276978 A     10/2005
JP     2005-333009 A     12/2005
(Continued)

*Primary Examiner* — Bradley Smith
*Assistant Examiner* — David J Goodwin
(74) *Attorney, Agent, or Firm* — Venable LLP

(57) ABSTRACT

A method of manufacturing a semiconductor substrate includes: forming a barrier metal layer on a semiconductor substrate; forming a resist mask on the barrier metal layer; performing dry etching on a portion of the barrier metal layer, which is exposed from an opening portion of the resist mask, so that the dry etching is prevented from reaching a top surface of a layer immediately under the barrier metal layer; performing wet etching on a portion of the barrier metal layer exposed by the dry etching so that the wet etching reaches the top surface of the layer immediately under the barrier metal layer and a portion of the barrier metal layer remains; and stripping the resist mask.

10 Claims, 7 Drawing Sheets

(51) Int. Cl.
*H01L 21/3213* (2006.01)
*H01L 21/285* (2006.01)

(56) References Cited

U.S. PATENT DOCUMENTS

| | | |
|---|---|---|
| 7,221,054 B2 | 5/2007 | Minda |
| 7,270,398 B2 | 9/2007 | Sasaki et al. |
| 9,099,627 B2 | 8/2015 | Totani et al. |
| 9,200,974 B2 | 12/2015 | Matsunami et al. |
| 9,266,331 B2 * | 2/2016 | Sakuma ............... B41J 2/1637 |
| 9,599,893 B2 * | 3/2017 | Horiuchi .............. B41J 2/1631 |
| 9,610,773 B2 | 4/2017 | Ibe et al. |
| 2007/0268327 A9 * | 11/2007 | Silverbrook ......... B41J 2/14314 |
| | | 347/20 |
| 2012/0047738 A1 * | 3/2012 | Koyama ............... B41J 2/1604 |
| | | 29/890.1 |
| 2013/0083569 A1 * | 4/2013 | Minoura ........... H01L 29/66462 |
| | | 363/37 |
| 2018/0277503 A1 * | 9/2018 | Sasaki ................. B41J 2/1631 |

FOREIGN PATENT DOCUMENTS

| | | |
|---|---|---|
| JP | 2011-54010 A | 3/2011 |
| JP | 2011-129669 A | 6/2011 |
| JP | 2012-94812 A | 5/2012 |
| JP | 2013-77609 A | 4/2013 |
| JP | 2015-10931 A | 1/2015 |
| JP | 2016-141149 A | 8/2016 |

\* cited by examiner

US 10,882,318 B2

METHOD OF MANUFACTURING SEMICONDUCTOR SUBSTRATE AND METHOD OF MANUFACTURING SUBSTRATE FOR LIQUID EJECTION HEAD

BACKGROUND OF THE INVENTION

Field of the Invention

The present invention relates to a method of manufacturing a semiconductor substrate and a method of manufacturing a substrate for a liquid ejection head.

Description of the Related Art

As a liquid ejection method of a liquid ejection head, which ejects a liquid droplet from an ejection orifice, there is given a method in which thermal energy is caused to act on a liquid to obtain a motive force for the ejection of the liquid droplet. In this liquid ejection method, the liquid acted upon by thermal energy is overheated to generate an air bubble, and an acting force based on the generation of the air bubble causes a liquid droplet to be ejected from an orifice at a tip of a liquid ejection head portion. The liquid droplet adheres to a recording medium to record information.

A liquid ejection head employed in this type of liquid ejection recording method generally has an orifice from which a liquid is ejected and an air bubble generation portion communicating with the orifice. The air bubble generation portion includes a heat action portion, in which thermal energy acts on a liquid, and a liquid flow path, which has the heat action portion as a part of its configuration. The air bubble generation portion further includes a heat generating resistor layer serving as a heat converter, which is a unit for generating thermal energy, an upper protective layer for protecting the heat generating resistor layer from an ejected liquid (ink), and a lower layer for heat accumulation.

An element substrate for the liquid ejection head includes an electrode pad portion, which forms electric connection and to which electric power is supplied from the outside, and a heating element, which is controlled so that a liquid is heated and ejected.

The electrode pad portion includes a wiring layer, which forms electric connection, a barrier metal layer, which is made of high-melting point metal or the like, and an Au layer. In the process of forming the electrode pad portion, the barrier metal layer and the Au layer are separately processed by wet etching so that an edge portion of the barrier metal layer is exposed.

In Japanese Patent Application Laid-Open No. 2015-10931, there is disclosed a semiconductor pressure sensor device having a laminate layer formed of an adhesion level securing/diffusion preventing layer (a laminate film formed of a Cr film and a Pt film, or the like) and a conductive layer (an Au film or the like) forming a pad electrode. The disclosure includes a configuration in which an edge surface of the metal laminate layer has a forward tapered shape widening toward the semiconductor substrate side. The tapered shape configuration is formed by dry etching of the edge portion of the laminate metal layer through ion milling. The publication states that, with this method, minute gaps formed due to side etching in the wet etching treatment can be prevented, and corrosion can consequently be reduced.

SUMMARY OF THE INVENTION

According to one aspect of the present invention, there is provided a method of manufacturing a semiconductor substrate including: forming a barrier metal layer on a semiconductor substrate; forming a resist mask on the barrier metal layer; performing dry etching on a portion of the barrier metal layer, which is exposed from an opening portion of the resist mask, so that the dry etching is prevented from reaching a top surface of a layer immediately under the barrier metal layer; performing wet etching on a portion of the barrier metal layer exposed by the dry etching so that the wet etching reaches the top surface of the layer immediately under the barrier metal layer and a portion of the barrier metal layer remains; and stripping the resist mask.

According to another aspect of the present invention, there is provided a method of manufacturing a substrate for a liquid ejection head, the substrate including a wiring layer, an insulating layer on the wiring layer, a barrier metal layer on the wiring layer and the insulating layer, and an electrode layer on the barrier metal layer, the electrode layer being electrically connected to the wiring layer through intermediation of the barrier metal layer, the method including: forming the barrier metal layer on the wiring layer and on the insulating layer; forming a resist mask on the barrier metal layer; performing dry etching on a portion of the barrier metal layer, which is exposed from an opening portion of the resist mask, so that the dry etching is prevented from reaching the insulating layer; performing wet etching on a portion of the barrier metal layer exposed by the dry etching so that the wet etching reaches the insulating layer; stripping the resist mask; and forming the electrode layer on a portion of the barrier metal layer that remains after the wet etching.

Further features of the present invention will become apparent from the following description of exemplary embodiments with reference to the attached drawings.

DESCRIPTION OF THE EMBODIMENTS

In the process of manufacturing a liquid ejection head, various solvents are used for processing. When an edge portion of a barrier metal layer forming a pad electrode is exposed, the exposed portion of the barrier metal layer is dissolved in a solvent during the processing, and the dissolving can progress to the corrosion of a wiring layer.

The method in which an edge portion of a barrier metal layer is processed so as to have a forward tapered shape by ion milling has a difficulty in providing a tapered shape that is satisfactorily effective for corrosion prevention. There is a fear of another difficulty in securing a desired width dimension with precision. The method also requires taking into account the etch selectivity ratio with respect to an underlying insulating layer, resulting in a difficulty in forming a desired tapered shape.

It is therefore an object of the present invention to provide a manufacturing method with which a highly reliable substrate for a liquid ejection head can be formed by forming a forward tapered shape in an edge portion of a barrier metal layer while maintaining precision of a width dimension of the barrier metal layer, and thus reducing corrosion of the barrier metal layer and a wiring layer.

According to the present invention, a method of manufacturing a substrate for a liquid ejection head can be provided with which a tapered shape can be formed in an edge portion of a barrier metal layer while maintaining the precision of the width dimension of the barrier metal layer, the corrosion of the barrier metal layer and a wiring layer is suppressed, and a highly reliable substrate for a liquid ejection head can be manufactured.

A substrate for a liquid ejection head that is manufactured by a manufacturing method according to one embodiment of the present invention includes a wiring layer on a substrate, an insulating layer on the wiring layer, a barrier metal layer on the wiring layer and the insulating layer, and an electrode pad covering the barrier metal layer.

An example of this substrate for a liquid ejection head is described first with reference to the drawings. The following description takes an ink jet head as an example of the liquid ejection head.

Figure 1A:
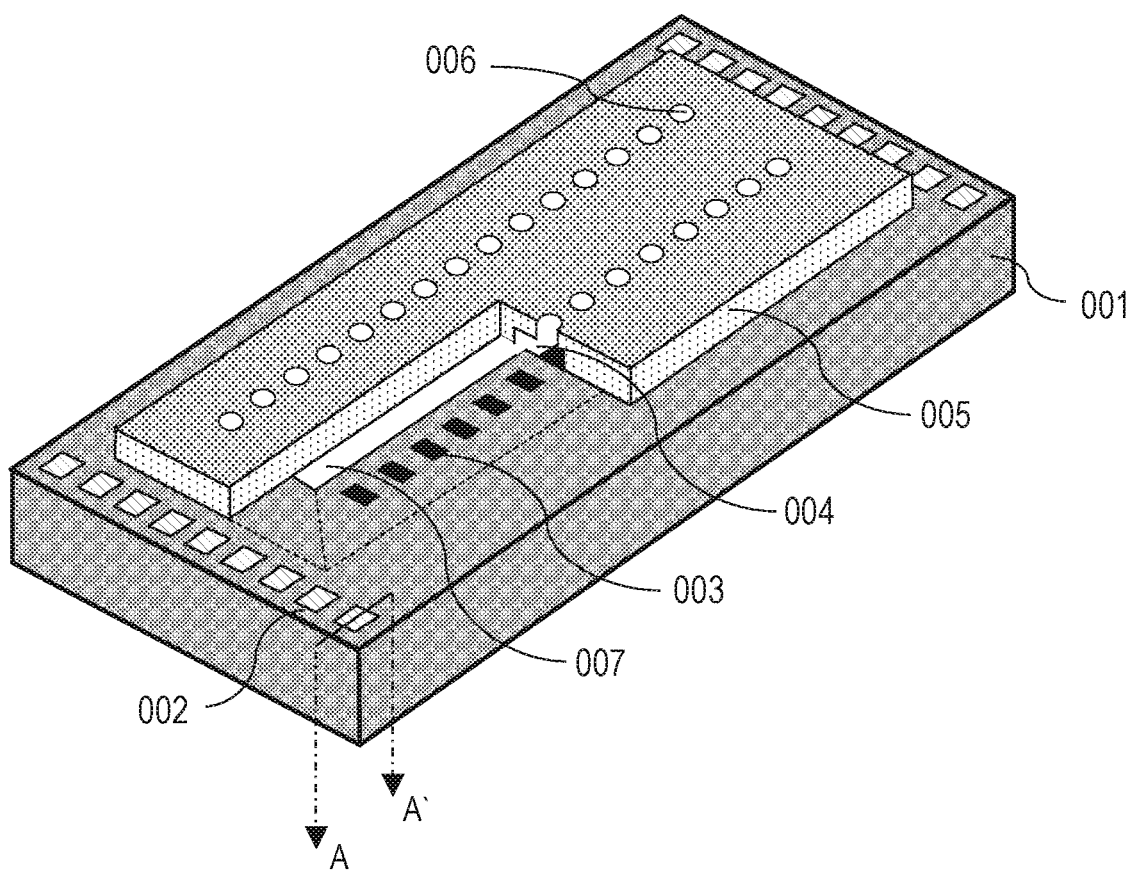
FIG. 1A and FIG. 1B are explanatory diagrams of the structure of a substrate for a liquid ejection head that is manufactured by a manufacturing method according to one embodiment of the present invention (FIG. 1A is a perspective view and FIG. 1B is a sectional view taken along the line A-A').
Figure 1B:
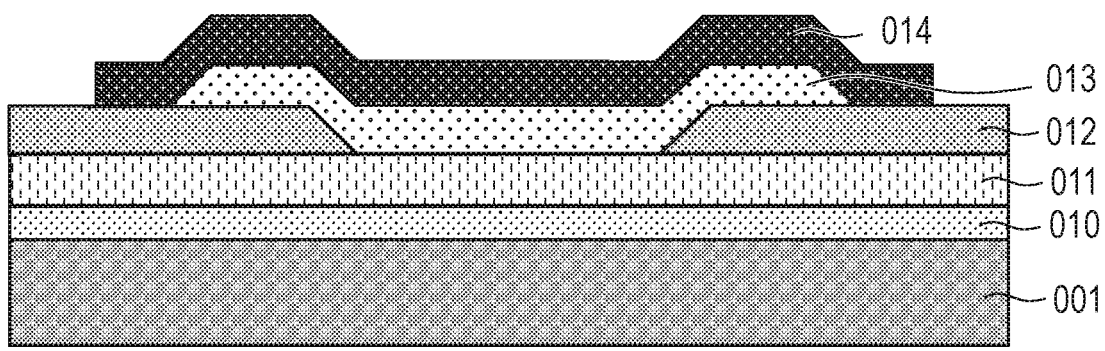

FIG. 1A is a perspective view of the substrate for a liquid ejection head that is manufactured by a manufacturing method according to one embodiment of the present invention. FIG. 1B is a sectional view taken along the line A-A' in FIG. 1A.

As illustrated in FIG. 1A, the substrate for a liquid ejection head has a configuration in which electrode pads 002 and a nozzle resin material 005 are formed on a silicon substrate 001. Ink ejection orifices 006 and ink bubbling chambers 004 leading the ink ejection orifices are formed in the nozzle resin material 005. Heaters 003 are formed on areas of the silicon substrate inside the ink bubbling chambers 004. An ink supply port 007 is formed in the silicon substrate so as to communicate with the ink bubbling chambers 004.

As illustrated in FIG. 1B, each electrode pad has a configuration in which a first insulating layer 010 is formed on the silicon substrate 001, a wiring layer 011 is formed on the first insulating layer 010, and a second insulating layer 012 is formed so as to partially expose the wiring layer 011. A barrier metal layer 013 is formed so as to cover the exposed portion of the wiring layer 011, and an Au layer 014 (the electrode pad 002) is formed so as to cover the barrier metal layer 013. The Au layer 014 is electrically connected to the wiring layer 011 via the barrier metal layer 013.

In the manufacturing process configured as above, corrosion from a solvent can be prevented by patterning the barrier metal layer and the Au layer separately and coating the barrier metal layer with the Au layer so as not to expose an edge portion of the barrier metal layer. The barrier metal layer, however, cannot be covered satisfactorily with the Au layer depending on the shape of the edge portion of barrier metal layer in some cases. To address this, a peripheral edge portion of the barrier metal layer is formed into a forward tapered shape (a shape in which the peripheral edge surfaces of the barrier metal layer widen toward the silicon substrate side), thereby facilitating the satisfactory covering of the peripheral edge portion. Through formation of an electrode pad portion in this manner, the corrosion of the barrier metal layer and the wiring layer can be suppressed, and a highly reliable substrate for a liquid ejection head can be manufactured.

It is preferred for the forward tapered shape of the peripheral edge portion of the barrier metal layer to have a taper angle of 30° or more, and a taper angle of 35° or more is even more preferred from the viewpoint of dimension precision. From the viewpoint of coverage, the taper angle is preferred to be less than 70° and a taper angle of 65° or less is even more preferred. Through formation of the peripheral edge portion of the barrier metal layer in a tapered shape so that the taper angle is 30° or more and less than 70°, the edge portion can be covered at high coverage with an electrode layer, which is an Au layer or the like. The taper angle here is defined as an angle formed by the peripheral edge surface (etched surface) of the barrier metal layer with respect to the plane of the silicon substrate 001 on the barrier metal layer side. The taper angle can be measured from cross-section observation using a focused ion beam-scanning electron microscope (FIB-SEM).

A method of manufacturing the semiconductor substrate having the above-mentioned configuration includes: forming a barrier metal layer 013 on a semiconductor substrate; forming a resist mask on the barrier metal layer; performing dry etching on a portion of the barrier metal layer, which is exposed from an opening portion of the resist mask, so that the dry etching is prevented from reaching a top surface of a layer (second insulating layer 012) immediately under the barrier metal layer; performing wet etching on a portion of the barrier metal layer that remains after the dry etching so that the wet etching reaches the top surface of the layer (second insulating layer 012) immediately under the barrier metal layer; and stripping the resist mask.

The step of forming a resist mask can include a step of applying a resist for forming a mask onto the barrier metal layer, a step of exposing the resist and transferring a mask pattern to the resist, and a step of developing the resist to form a resist mask.

The dry etching is preferred to be isotropic dry etching because of the ease of shaping a peripheral edge portion of the barrier metal layer into a tapered shape, and for other reasons. Isotropic dry etching can be performed with the use of Chemical Dry Etching Equipment CDE-80N (trade name; manufactured by SHIBAURA MECHATRONICS CORPORATION). With this equipment, isotropic etching using microwave remote plasma is performed.

In the etching of the barrier metal layer, it is easier to shape the peripheral edge portion of the barrier metal layer into a tapered shape by dry etching than by wet etching, and dry etching is also capable of giving a tapered surface (an etched surface of the peripheral edge portion) a greater slant to make the taper angle small. With such dry etching, the tapered angle can be reduced to, for example, about 30°. When the barrier metal layer is etched by dry etching until the top surface of a layer immediately under the barrier metal layer is reached, it is difficult to secure the etch selectivity ratio with respect to the immediate underlayer, which can result in accidental etching of the immediate underlayer. The accidental etching of the immediate underlayer may lead to the exposure of a layer further below the immediate underlayer, depending on the thickness of the immediate underlayer. Meanwhile, when the barrier metal layer is etched by wet etching it is easy to secure the etch selectivity ratio with respect to the layer immediately under the barrier metal layer, and the accidental etching of the immediate underlayer can consequently be prevented. However, the taper angle of the barrier metal layer etched by wet etching increases as the wet etching time is prolonged, and can be close to 90°. This means that, when the barrier metal layer is etched by wet etching until the top surface of the immediate underlayer is reached, the etched surface of the peripheral edge portion of the barrier metal layer forms an angle close to 90° with respect to the substrate plane. It is difficult to cover the peripheral edge portion of the barrier metal layer like this well with the wiring layer. The manufacturing method according to one embodiment of the present invention deals with the issue using wet etching and dry etching in combination to etch the barrier metal layer and shape the peripheral edge portion of the barrier metal layer into a tapered shape. Here, the tapered shape can be controlled by adjusting the length (etching amount) of dry etching and the length (etching amount) of wet etching. The taper angle tends to be small when the dry etching time is long and the wet etching time is short.

Regarding the precision of the width dimension, wet etching is larger in side etching amount (the amount of etching in a lateral direction, namely, the amount of etching in a direction parallel to the substrate plane) than dry etching. When the barrier metal layer is etched by such wet etching until the top surface of the immediate underlayer is reached, the large side etching amount makes it difficult to obtain a desired dimension precision. The side etching amount can be reduced by setting the dry etching time long and the wet etching time short, with the result that it is easier to secure a desired precision of the width dimension.

In view of the above, the etching amount in which the barrier metal layer is etched by the dry etching in a thickness direction of the barrier metal layer is larger than the etching amount in which the barrier metal layer is etched by the wet etching in the thickness direction of the barrier metal layer. Further, 70% or more of a thickness of the barrier metal layer in the forming of the barrier metal layer is etched by the dry etching, and a remaining portion, which is 30% or less of the thickness of the barrier metal layer in the forming of the barrier metal layer, is etched by the wet etching. The etching amount ratio described above is preferred when fluctuations in etching rate are taken into consideration.

According to the manufacturing method described above, the electrode layer can be formed so as to cover a peripheral edge portion of the barrier metal layer. In this formation, it is preferred that the peripheral edge portion of the barrier metal layer be formed into a tapered shape, and that the electrode layer be formed so as to cover the peripheral edge portion having the tapered shape. Further, the electrode layer is preferred to be formed so as to be in contact with a top surface of a portion of the insulating layer that is on a periphery of the barrier metal layer. The manufacturing method described above further includes processing the electrode layer to form an electrode pad, wherein the electrode pad covers a peripheral edge portion of the barrier metal layer, and is in contact with the top surface of the portion of the insulating layer that is on the periphery of the barrier metal layer.

As a first embodiment, the stripping of the resist mask can be conducted after wet etching (Example 1 described later, FIG. 2A to FIG. 2J).

As a second embodiment, the stripping of the resist mask can be conducted before wet etching. The barrier metal layer in the second embodiment is set thick enough to retain a given thickness after wet etching (Example 2 described later, FIG. 3A to FIG. 3J).

As a third embodiment, the resist mask (a first resist mask) is stripped before wet etching, and a second resist mask smaller in size than the first resist mask is subsequently formed. Specifically, the second resist mask is formed so that the size (the width in the direction of the substrate plane) of the second resist mask corresponds to the objective given size (the width in the direction of the substrate plane) of the barrier metal layer, and the first resist mask is set to a size (the width in the direction of the substrate plane) larger than the given size. The second resist mask is formed inside an area in which the first resist mask has been formed. As a result, a barrier metal layer portion unetched by dry etching is situated in the periphery of the second resist mask (FIG. 4F). The barrier metal layer portion in the periphery of the second resist mask is utilized for the forming of the tapered shape. The thus formed second resist mask is used as an etching mask in the wet etching of the barrier metal layer (Example 3 described later, FIG. 4A to FIG. 4L). Through performing of wet etching in this manner, the peripheral edge portion of the barrier metal layer that is formed by the manufacturing method according to the third embodiment can have a taper angle smaller than the taper angle of the peripheral edge portion of the barrier metal layer that is formed by the manufacturing method according to the first embodiment. For example, the taper angle in the third embodiment can be reduced by about 10° (the tapered surface of the peripheral edge portion can be slanted lower by about 10°). From the viewpoint of fully obtaining this effect, the peripheral edge of the second resist mask is preferred to be placed at least 1 μm inside the peripheral edge of the region in which the first resist mask has been formed.

EXAMPLES

In the following, the method of manufacturing a substrate for a liquid ejection head in which the electrode pad portion included in the substrate has the configuration described above is described in more detail through Examples.

Example 1

Details of the method of manufacturing a substrate for a liquid ejection head according to one embodiment of the present invention are described below through Example 1 with reference to FIG. 2A to FIG. 2J. FIG. 2A to FIG. 2J are sectional views for illustrating the process of manufacturing the electrode pad portion of the substrate for a liquid ejection head according to Example 1 of the present invention.

Figure 2A:
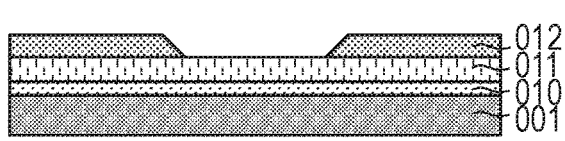
FIG. 2A, FIG. 2B, FIG. 2C, FIG. 2D, FIG. 2E, FIG. 2F, FIG. 2G, FIG. 2H, FIG. 2I, and FIG. 2J are sectional views for illustrating steps of a method of manufacturing a substrate for a liquid ejection head according to Example 1 of the present invention.

As illustrated in FIG. 2A, the first insulating layer 010 is formed on the silicon substrate 001. The first insulating layer 010 can be formed as follows:

First, an insulating film is formed on the silicon substrate 001 by chemical vapor deposition (CVD) to have a thickness of approximately 500 nm, and is subsequently processed by photolithography. Specifically, a resist was selectively formed on the insulating film so as to serve as an etching mask, and the insulating film was etched by reactive ion etching using. Plasma ashing using $O_2$ and wet stripping treatment were then performed to remove the resist and a residue of the etching. The first insulating layer 010 obtained by processing the insulating film in this manner can be formed from, for example, SiO. The material of the first insulating layer is not particularly limited as long as the material is an insulative material, and may be SiN, for example.

The wiring layer 011 is formed next on the first insulating layer 010 (FIG. 2A). The wiring layer 011 can be formed as follows:

First, a conductive film is formed by sputtering to have a thickness of approximately 200 nm, and is subsequently processed by photolithography. Specifically, a resist was selectively formed on the conductive film so as to serve as an etching mask, and wet etching was then performed with the use of an etchant for AL, which was a mixture of acetic acid and phosphoric acid, to selectively remove the conductive film. Plasma ashing using $O_2$ and wet stripping treatment were subsequently performed to remove the resist and a residue of the etching, to thereby obtain the wiring layer 011. The wiring layer 011 can be formed from, for example, Al, but is not limited to a particular material as long as a conductive material having an electric resistance of $9 \times 10^{-8}$ Ωm or less is used. For example, gold, silver, or copper may be used to form the wiring layer 011.

The second insulating layer 012 is subsequently formed so as to partially expose the wiring layer 011 (FIG. 2A). The second insulating layer 012 can be formed as follows:

First, an insulating film is formed by chemical vapor deposition (CVD) to have a thickness of approximately 200 nm, and is subsequently processed by photolithography. Specifically, a resist was selectively formed on the insulating film so as to serve as an etching mask, and the insulating film was etched by reactive ion etching (RIE) using $CF_4$. Plasma ashing using $O_2$ and wet stripping treatment were subsequently performed to remove the resist and a residue of the etching, to thereby obtain the second insulating layer 012. The second insulating layer 012 can be formed from, for example, SiO. The material of the second insulating layer is not particularly limited as long as the material is an insulative material, and may be SiN or SiCN, for example.

Figure 2F:
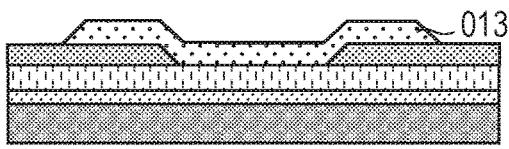
Figure 2B:
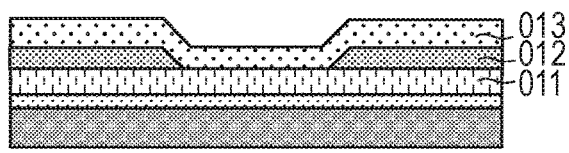

As illustrated in FIG. 2B, the barrier metal layer 013 is formed next on the second insulating layer 012 and the wiring layer 011. The barrier metal layer 013 was formed by sputtering to have a thickness of approximately 200 nm. The material of the barrier metal layer 013 can be, for example, TiW.

Figure 2G:
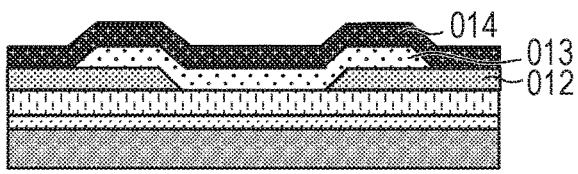
Figure 2C:
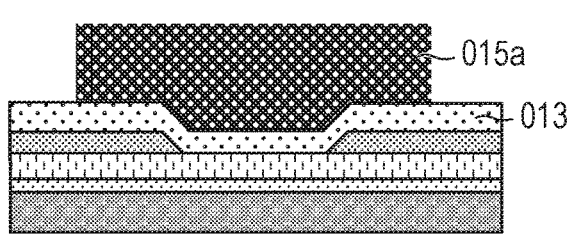

As illustrated in FIG. 2C, a resist mask 015*a* is subsequently formed on the barrier metal layer 013. The resist mask 015*a* was formed as follows:

First, a positive resist was applied by spin coating to have a thickness of approximately 6 μm. A glass mask on which a pattern was selectively drawn was then used to perform i-ray exposure, and development was subsequently performed to dissolve and remove the exposed portion. The positive resist can be, for example, PMER P-LA 300 PM (trade name; manufactured by TOKYO OHKA KOGYO CO., LTD.). The positive resist used in Example 1 is not particularly limited as long as the positive resist is made of a material that can be exposed by i-ray exposure, and THMR-iP-5700 (trade name; manufactured by TOKYO OHKA KOGYO CO., LTD.), for example, can be used. A liquid developer for dissolving the exposed portion of the resist can be NMD-3 (trade name; manufactured by TOKYO OHKA KOGYO CO., LTD.), for example. The liquid developer used in Example 1 is not particularly limited as long as the exposed portion of the resist can be dissolved therewith, and MIBK manufactured by Hayashi Pure Chemical Ind., Ltd., for example, can be used.

Figure 2H:
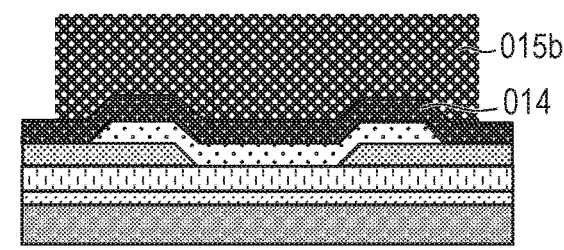
Figure 2D:
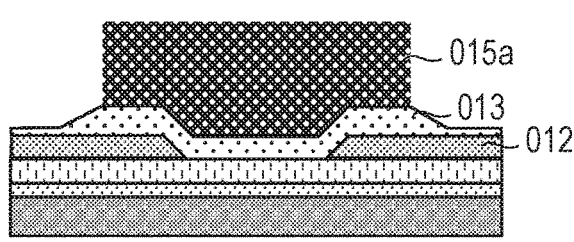

As illustrated in FIG. 2D, most of the barrier metal layer 013 in its thickness direction is removed next by dry etching in opening portions of the resist mask 015*a* so as not to expose the second insulating layer 012.

Here, the dry etching is performed so as not to allow an etchant, which is an ion, a radical, or the like, to reach the second insulating layer 012. The second insulating layer 012 is thus prevented from being etched by the dry etching. The portion of the barrier metal layer 013 removed by the dry etching has a thickness of approximately 150 nm (the etching amount in the thickness direction), and the thickness of the remaining barrier metal layer is approximately 50 nm. In order to shape an edge portion of the barrier metal layer 013 into a forward tapered shape, the removed portion of the barrier metal layer 013 removed by dry etching is preferred to have a thickness (the etching amount in the thickness direction) greater than 50% of the thickness of the barrier metal layer at the time when the barrier metal layer is formed, and a thickness equal to or greater than 70% of the thickness at the time of forming is even more preferred. An etching gas used in the dry etching can be $CF_4$ gas, but is not particularly limited as long as the barrier metal layer 013 can be removed therewith. For example, a gas that is a mixture of $O_2$ and $N_2$ may be used as the etching gas. Chemical Dry Etching Equipment CDE-80N (trade name; manufactured by SHIBAURA MECHATRONICS CORPORATION), for example, can be used as a dry etching device. With this equipment, isotropic etching using microwave remote plasma is performed.

Figure 2I:
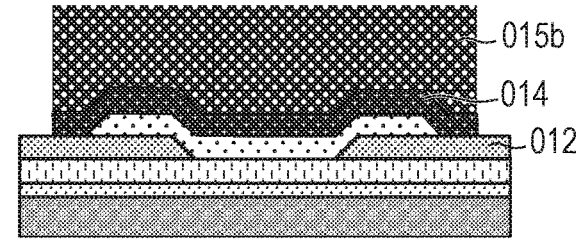
Figure 2E:
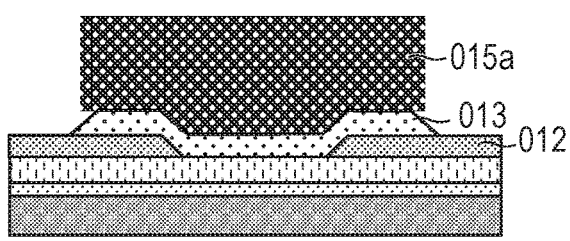

As illustrated in FIG. 2E, the remaining barrier metal layer 013 in the opening portions of the resist mask 015*a* is subsequently removed by wet etching to expose the second insulating layer 012.

Before the wet etching is started (FIG. 2D), 150 nm of the barrier metal layer 013 out of 200 nm, which is the thickness of the barrier metal layer 013 at the time when the barrier metal layer 013 is formed, is removed first by dry etching and the remaining barrier metal layer has a thickness of approximately 50 nm. Because the remaining barrier metal layer is thin as above, the amount of etching required to expose the second insulating layer under the thin portion of the barrier metal layer may be small, and the etching time can accordingly be shortened. The precision of the dimension in the lateral direction (the direction of the substrate plane) can therefore be maintained, and the edge portion can retain the forward tapered shape formed in the dry etching as well.

From the viewpoint of forming such a forward tapered shape, the portion of the barrier metal layer to be removed by the wet etching is preferred to have a thickness (the etching amount in the thickness direction) less than 50% of the thickness of the barrier metal layer at the time when the barrier metal layer is formed, and a thickness equal to or less than 30% of the thickness at the time of forming is even more preferred.

An etchant used in the wet etching can be a hydrogen peroxide solution having a concentration of 31%. The etchant is not limited to a particular temperature or a particular concentration, and a temperature and concentration suitable for the thickness of the film to be removed can be selected.

As illustrated in FIG. 2F, the resist mask 015*a* is subsequently removed to expose the entire surface (a surface that is not in contact with the underlying layer) of the barrier metal layer 013. Here, the edge portion of the barrier metal layer 013 has a forward tapered shape. The edge portion can have a forward taper angle (the angle of the edge surface of the barrier metal layer with respect to the substrate plane) about less than 70°.

The resist mask 015a can be stripped with the use of a stripping solution, for example, Microposit Remover 1112A (trade name; manufactured by Rohm and Haas Electronic Materials LLC). The stripping solution of the resist mask is not particularly limited as long as the unexposed portion (mask) of the positive resist used can be dissolved therewith, and a thinner OK-73 (trade name; manufactured by TOKYO OHKA KOGYO CO., LTD.), for example, can be used.

After the resist mask was stripped, oven baking treatment was performed. The treatment temperature was set to approximately 120° C., and the treatment time was set to 30 minutes. Through such oven baking treatment, moisture left from water washing in the step of stripping the resist mask is evaporated well and a dried state is reached.

As illustrated in FIG. 2G, the Au layer 014 is subsequently formed so as to cover the entire exposed surface (the surface that is not in contact with the underlying layer) of the barrier metal layer 013. The Au layer 014 is formed by sputtering to have a thickness of approximately 200 nm.

As illustrated in FIG. 2H, a resist mask 015b is subsequently formed on the Au layer 014. The resist mask 015b was formed as follows:

First, a positive resist was applied by spin coating to have a thickness of approximately 6 µm. A glass mask on which a pattern was selectively drawn was then used to perform i-ray exposure, and development was subsequently performed to dissolve and remove the exposed portion.

The positive resist can be, for example, PMER P-LA 300 PM (trade name; manufactured by TOKYO OHKA KOGYO CO., LTD.). The positive resist used in Example 1 is not particularly limited as long as the positive resist is made of a material that can be exposed by i-ray exposure, and THMR-iP-5700 (trade name; manufactured by TOKYO OHKA KOGYO CO., LTD.), for example, can be used. A liquid developer for dissolving the exposed portion of the resist can be NMD-3 (trade name; manufactured by TOKYO OHKA KOGYO CO., LTD.), for example. The liquid developer used in Example 1 is not particularly limited as long as the exposed portion of the resist can be dissolved therewith, and MIBK manufactured by Hayashi Pure Chemical Ind., Ltd., for example, can be used.

As illustrated in FIG. 2I, etching is subsequently performed with the resist mask 015b as an etching mask, to selectively remove the Au layer 014. The second insulating layer 012 is exposed at a portion from which the Au layer has been removed. In this manner, the Au layer 014 is processed so as to have the shape of an electrode pad. Here, as illustrated in FIG. 2I, the Au layer 014 is processed so as to be greater in width dimension (the dimension in the direction of the substrate plane) than the barrier metal layer. In other words, a lower surface of a peripheral edge portion of the processed Au layer 014 (the electrode pad) is in contact with the top surface of the second insulating layer 012. The Au layer 014 can be processed by wet etching using an iodine-based etchant, for example, AURUM (trade name; manufactured by KANTO CHEMICAL CO., INC.). The etchant used in Example 1 is not particularly limited as long as Au can be etched therewith, and Pure Etch AU (trade name; manufactured by Hayashi Pure Chemical Ind., Ltd.), for example, can be used as an etchant containing iodine.

Figure 2J:
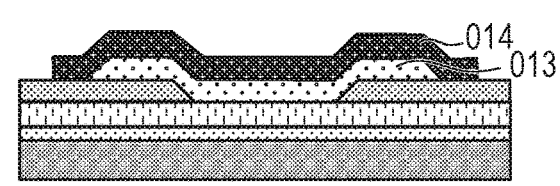

As illustrated in FIG. 2J, the resist mask 015b is subsequently removed to expose the entire surface (the top surface and edge surface) of the Au layer 014. The resist mask 015b can be stripped with the use of, for example, Microposit Remover 1112A (trade name; manufactured by Rohm and Haas Electronic Materials LLC). The stripping solution of the resist mask is not particularly limited as long as the unexposed portion of the resist used can be dissolved therewith, and a thinner OK-73 (trade name; manufactured by TOKYO OHKA KOGYO CO., LTD.), for example, can be used.

After the resist mask was stripped, oven baking treatment was performed. The treatment temperature was set to approximately 120° C., and the treatment time is set to 30 minutes. Through such oven baking treatment, moisture left from water washing in the step of stripping the resist mask is evaporated well and a dried state is reached.

Through the manufacturing process described above, the electrode pad portion of the substrate for a liquid ejection head according to Example 1 of the present invention can be formed. Through the formation of the electrode pad portion in this manner, the corrosion of the barrier metal layer and the wiring layer is suppressed, the precision of the width dimension of the electrode pad portion including the barrier metal layer can be secured, and a highly reliable substrate for a liquid ejection head is consequently provided. Accidental etching of the insulating layer immediately under the barrier metal layer can also be prevented when the barrier metal layer is etched. In Example 1, the precision of the width dimension of the electrode pad portion including the barrier metal layer is secured at a central value ±1.0 µm.

Example 2

Details of the method of manufacturing a substrate for a liquid ejection head according to one embodiment of the present invention are described below through Example 2 with reference to FIG. 3A to FIG. 3J. FIG. 3A to FIG. 3J are sectional views for illustrating the process of manufacturing the electrode pad portion of the substrate for a liquid ejection head according to Example 2 of the present invention.

Figure 3A:
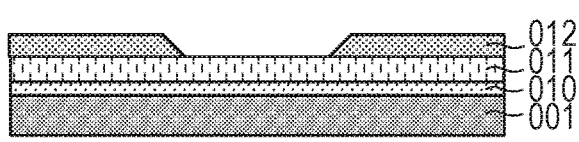
FIG. 3A, FIG. 3B, FIG. 3C, FIG. 3D, FIG. 3E, FIG. 3F, FIG. 3G, FIG. 3H, FIG. 3I, and FIG. 3J are sectional views for illustrating steps of a method of manufacturing a substrate for a liquid ejection head according to Example 2 of the present invention.

As illustrated in FIG. 3A, the first insulating layer 010 is formed on the silicon substrate 001. The first insulating layer 010 can be formed as follows:

First, an insulating film is formed on the silicon substrate 001 by chemical vapor deposition (CVD) to have a thickness of approximately 500 nm, and is subsequently processed by photolithography. Specifically, a resist was selectively formed on the insulating film so as to serve as an etching mask, and the insulating film was etched by reactive ion etching using $CF_4$. Plasma ashing using $O_2$ and wet stripping treatment were then performed to remove the resist and a residue of the etching. The first insulating layer 010 obtained by processing the insulating film in this manner can be formed from, for example, SiO. The material of the first insulating layer is not particularly limited as long as the material is an insulative material, and may be SiN, for example.

The wiring layer 011 is formed next on the first insulating layer 010 (FIG. 3A). The wiring layer 011 can be formed as follows:

First, a conductive film is formed by sputtering to have a thickness of approximately 200 nm, and is subsequently processed by photolithography. Specifically, a resist was selectively formed on the conductive film so as to serve as an etching mask, and wet etching was then performed with the use of an etchant for AL, which was a mixture of acetic acid and phosphoric acid, to selectively remove the conductive film. Plasma ashing using $O_2$ and wet stripping treatment were subsequently performed to remove the resist and a residue of the etching, to thereby obtain the wiring layer 011. The wiring layer 011 can be formed from, for example, Al, but is not limited to a particular material as long as a conductive material having an electric resistance of $9×10^{-8}$ Ωm or less is used. For example, gold, silver, or copper may be used to form the wiring layer 011.

The second insulating layer 012 is subsequently formed so as to partially expose the wiring layer 011 (FIG. 3A). The second insulating layer 012 can be formed as follows:

First, an insulating film is formed by chemical vapor deposition (CVD) to have a thickness of approximately 200 nm, and is subsequently processed by photolithography. Specifically, a resist was selectively formed on the insulating film so as to serve as an etching mask, and the insulating film was etched by reactive ion etching (RIE) using $CF_4$. Plasma ashing using $O_2$ and wet stripping treatment were subsequently performed to remove the resist and a residue of the etching, to thereby obtain the second insulating layer 012. The second insulating layer 012 can be formed from, for example, SiO. The material of the second insulating layer is not particularly limited as long as the material is an insulative material, and may be SiN or SiCN, for example.

Figure 3F:
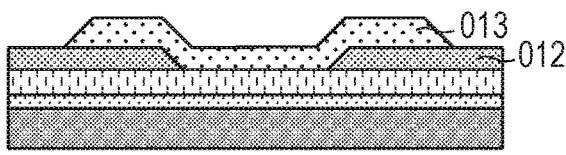
Figure 3B:
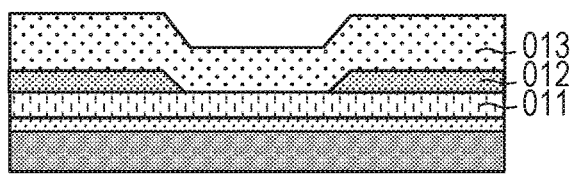

As illustrated in FIG. 3B, the barrier metal layer 013 is formed next on the second insulating layer 012 and the wiring layer 011. The barrier metal layer 013 was formed by sputtering to have a thickness of approximately 350 nm. The material of the barrier metal layer 013 can be, for example, TiW.

Figure 3G:
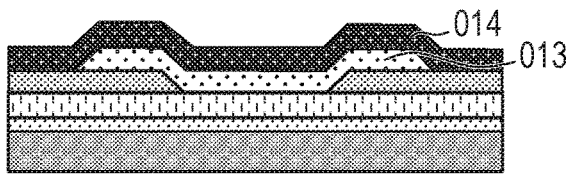
Figure 3C:
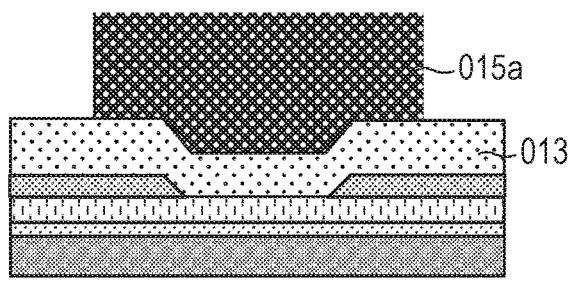

As illustrated in FIG. 3C, a resist mask 015*a* is subsequently formed on the barrier metal layer 013. The resist mask 015*a* was formed as follows:

First, a positive resist was applied by spin coating to have a thickness of approximately 6 μm. A glass mask on which a pattern was selectively drawn was then used to perform i-ray exposure, and development was subsequently performed to dissolve and remove the exposed portion. The positive resist can be, for example, PMER P-LA 300 PM (trade name; manufactured by TOKYO OHKA KOGYO CO., LTD.). The positive resist used in Example 2 is not particularly limited as long as the positive resist is made of a material that can be exposed by i-ray exposure, and THMR-iP-5700 (trade name; manufactured by TOKYO OHKA KOGYO CO., LTD.), for example, can be used. A liquid developer for dissolving the exposed portion of the resist can be NMD-3 (trade name; manufactured by TOKYO OHKA KOGYO CO., LTD.), for example. The liquid developer used in Example 2 is not particularly limited as long as the exposed portion of the resist can be dissolved therewith, and MIBK manufactured by Hayashi Pure Chemical Ind., Ltd., for example, can be used.

Figure 3H:
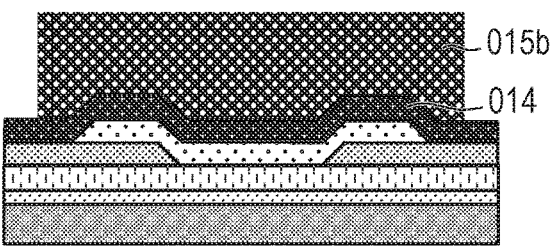
Figure 3D:
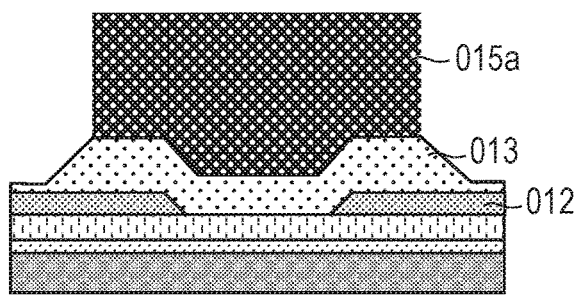

As illustrated in FIG. 3D, most of the barrier metal layer 013 in its thickness direction is removed next by dry etching in opening portions of the resist mask 015*a* so as not to expose the second insulating layer 012.

Here, the dry etching is performed so as not to allow an etchant, which is an ion, a radical, or the like, to reach the second insulating layer 012. The portion of the barrier metal layer 013 removed by the dry etching has a thickness of approximately 300 nm (the etching amount in the thickness direction), and the thickness of the remaining barrier metal layer is approximately 50 nm. In order to shape an edge portion of the barrier metal layer 013 into a forward tapered shape, the portion of the barrier metal layer 013 removed by dry etching is preferred to have a thickness (the etching amount in the thickness direction) greater than 50% of the thickness of the barrier metal layer at the time when the barrier metal layer is formed, and a thickness equal to or greater than 70% of the thickness at the time of forming is preferred. A gas used in the dry etching can be $CF_4$ gas, but is not particularly limited as long as the barrier metal layer 013 can be etched therewith. For example, a gas that is a mixture of $O_2$ and $N_2$ may be used as the etching gas. Chemical Dry Etching Equipment CDE-80N (trade name; manufactured by SHIBAURA MECHATRONICS CORPORATION), for example, can be used as a dry etching device. With this equipment, isotropic etching using microwave remote plasma is performed.

Figure 3I:
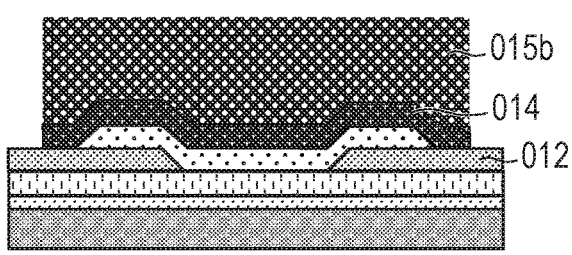
Figure 3E:
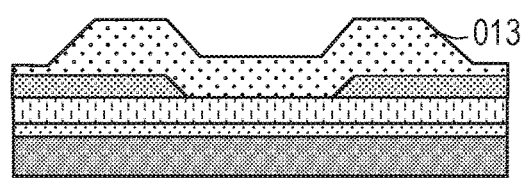

As illustrated in FIG. 3E, the resist mask 015*a* is subsequently removed to expose the entire surface (a surface that is not in contact with the underlying layer) of the barrier metal layer 013. The resist mask 015*a* can be stripped with the use of a stripping solution, for example, Microposit Remover 1112A (trade name; manufactured by Rohm and Haas Electronic Materials LLC). The stripping solution of the resist mask is not particularly limited as long as the unexposed portion (mask) of the positive resist used can be dissolved therewith, and a thinner OK-73 (trade name; manufactured by TOKYO OHKA KOGYO CO., LTD.), for example, can be used.

After the resist mask was stripped, oven baking treatment was performed. The treatment temperature was set to approximately 120° C., and the treatment time was set to 30 minutes. Through such oven baking treatment, moisture left from water washing in the step of stripping the resist mask is evaporated well and a dried state is reached.

As illustrated in FIG. 3F, wet etching is subsequently performed on the barrier metal layer 013 to partially expose the second insulating layer 012.

Before the wet etching is started (FIG. 3E), 300 nm of the barrier metal layer 013 out of 350 nm, which is the thickness of the barrier metal layer 013 at the time when the barrier metal layer 013 is formed, is removed first by dry etching and the remaining barrier metal layer has a thickness of approximately 50 nm. Through performing of wet etching in this state (after the removal of the resist mask), the portion of the barrier metal layer that is 50 nm in thickness is removed to expose the underlying second insulating layer 012. In the wet etching, the portion of the barrier metal layer that has the thickness of 350 nm at the time of forming, is etched by about 150 nm in the thickness direction, with the result that the remaining barrier metal layer has a thickness of approximately 200 nm. Because the dry etching performed first leaves a thin portion of the barrier metal layer, the amount of etching required to expose the second insulating layer under the thin portion of the barrier metal layer may be small, and the etching time can be accordingly shortened. The precision of the dimension in the lateral direction (the direction of the substrate plane) can therefore be maintained, and the edge portion can retain the forward tapered shape formed in the dry etching as well. The edge portion can have a forward taper angle (the angle of the edge surface of the barrier metal layer with respect to the substrate plane) about less than 70°, and the forward taper angle can even be 50° or less. The thickness of the barrier metal layer at the time of forming is set in consideration of wet etching conditions (the type and concentration of the etchant, and the etching time) so that the thickness of the barrier metal layer after the wet etching corresponds to a given thickness. In Example 2, considering that the given thickness and the wet etching amount are 200 nm and 150 nm, respectively, the thickness of the barrier metal layer at the time of forming is set to 350 nm.

From the viewpoint of forming such a forward tapered shape, the portion of the barrier metal layer to be removed by the wet etching is preferred to have a thickness (the etching amount in the thickness direction) less than 50% of the thickness of the barrier metal layer at the time when the barrier metal layer is formed, and a thickness equal to or less than 30% of the thickness at the time of forming is even more preferred.

An etchant used in the wet etching can be a hydrogen peroxide solution having a concentration of 31%. The etchant is not limited to a particular temperature or a particular concentration, and a temperature and concentration suitable for the thickness of the film to be removed can be selected.

As illustrated in FIG. 3G, the Au layer 014 is subsequently formed so as to cover the entire exposed surface (the surface that is not in contact with the underlying layer) of the barrier metal layer 013. The Au layer 014 is formed by sputtering to have a thickness of approximately 200 nm.

As illustrated in FIG. 3H, a resist mask 015b is formed on the Au layer 014. The resist mask 015b is formed as follows:

First, a positive resist was applied by spin coating to have a thickness of approximately 6 μm. A glass mask on which a pattern was selectively drawn was then used to perform i-ray exposure, and development was subsequently performed to dissolve and remove the exposed portion.

The positive resist can be, for example, PMER P-LA 300 PM (trade name; manufactured by TOKYO OHKA KOGYO CO., LTD.). The positive resist used in Example 2 is not particularly limited as long as the positive resist is made of a material that can be exposed by i-ray exposure, and THMR-iP-5700 (trade name; manufactured by TOKYO OHKA KOGYO CO., LTD.), for example, can be used. A liquid developer for dissolving the exposed portion of the resist can be NMD-3 (trade name; manufactured by TOKYO OHKA KOGYO CO., LTD.), for example. The liquid developer used in Example 2 is not particularly limited as long as the exposed portion of the resist can be dissolved therewith, and MIBK manufactured by Hayashi Pure Chemical Ind., Ltd., for example, can be used.

As illustrated in FIG. 3I, etching is subsequently performed with the resist mask 015b as an etching mask, to selectively remove the Au layer 014. The second insulating layer 012 is exposed at a portion from which the Au layer has been removed. In this manner, the Au layer 014 is processed so as to have the shape of an electrode pad. Here, as illustrated in FIG. 3I, the Au layer 014 is processed so as to be greater in width dimension (the dimension in the direction of the substrate plane) than the barrier metal layer. In other words, a lower surface of a peripheral edge portion of the processed Au layer 014 (the electrode pad) is in contact with the top surface of the second insulating layer 012. The Au layer 014 can be processed by wet etching using an iodine-based etchant, for example, AURUM (trade name; manufactured by KANTO CHEMICAL CO., INC.). The etchant used in Example 2 is not particularly limited as long as Au can be etched therewith, and Pure Etch AU (trade name; manufactured by Hayashi Pure Chemical Ind., Ltd.), for example, may be used as an etchant containing iodine.

Figure 3J:
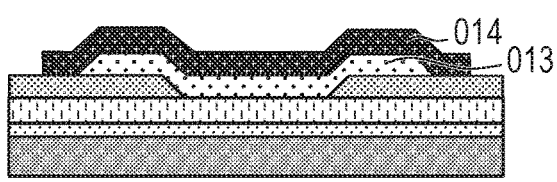

As illustrated in FIG. 3J, the resist mask 015b is subsequently removed to expose the entire surface (the top surface and edge surface) of the Au layer 014. The resist mask 015b can be stripped with the use of, for example, Microposit Remover 1112A (trade name; manufactured by Rohm and Haas Electronic Materials LLC). The stripping solution of the resist mask is not particularly limited as long as the unexposed portion of the resist used can be dissolved therewith, and a thinner OK-73 (trade name; manufactured by TOKYO OHKA KOGYO CO., LTD.), for example, can be used.

After the resist mask was stripped, oven baking treatment was performed. The treatment temperature was set to approximately 120° C., and the treatment time was set to 30 minutes. Through such oven baking treatment, moisture left from water washing in the step of stripping the resist mask is evaporated well and a dried state is reached.

Through the manufacturing process described above, the electrode pad portion of the substrate for a liquid ejection head according to Example 2 of the present invention can be formed. Through the forming of the electrode pad portion in this manner, the corrosion of the barrier metal layer and the wiring layer is suppressed, the precision of the width dimension of the electrode pad portion including the barrier metal layer can be secured, and a highly reliable substrate for a liquid ejection head is consequently provided. Accidental etching of the insulating layer immediately under the barrier metal layer can be prevented when the barrier metal layer is etched. In Example 2, the precision of the width dimension of the electrode pad portion including the barrier metal layer is secured at a central value ±1.0 μm.

Example 3

Details of the method of manufacturing a substrate for a liquid ejection head according to one embodiment of the present invention are described below through Example 3 with reference to FIG. 4A to FIG. 4L. FIG. 4A to FIG. 4L are sectional views for illustrating the process of manufacturing the electrode pad portion of the substrate for a liquid ejection head according to Example 3 of the present invention.

Figure 4A:
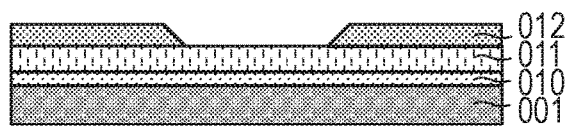
FIG. 4A, FIG. 4B, FIG. 4C, FIG. 4D, FIG. 4E, FIG. 4F, FIG. 4G, FIG. 4H, FIG. 4I, FIG. 4J, FIG. 4K, and FIG. 4L are sectional views for illustrating steps of a method of manufacturing a substrate for a liquid ejection head according to Example 3 of the present invention.
Figure 4F:
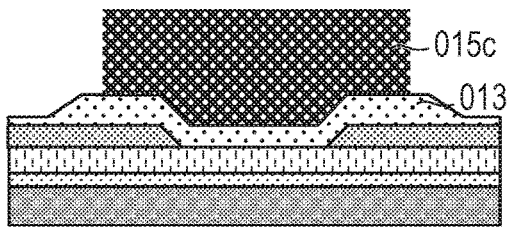

As illustrated in FIG. 4A, the first insulating layer 010 is formed on the silicon substrate 001. The first insulating layer 010 can be formed as follows:

First, an insulating film is formed on the silicon substrate 001 by chemical vapor deposition (CVD) to have a thickness of approximately 500 nm, and is subsequently processed by photolithography. Specifically, a resist was selectively formed on the insulating film so as to serve as an etching mask, and the insulating film was etched by reactive ion etching using $CF_4$. Plasma ashing using $O_2$ and wet stripping treatment were then performed to remove the resist and a residue of the etching. The first insulating layer 010 obtained by processing the insulating film in this manner can be formed from, for example, SiO. The material of the first insulating layer is not particularly limited as long as the material is an insulative material, and may be SiN, for example.

The wiring layer 011 is formed next on the first insulating layer 010 (FIG. 4A). The wiring layer 011 can be formed as follows:

First, a conductive film is formed by sputtering to have a thickness of approximately 200 nm, and is subsequently processed by photolithography. Specifically, a resist was selectively formed on the conductive film so as to serve as an etching mask, and wet etching was then performed with the use of an etchant for AL, which was a mixture of acetic acid and phosphoric acid, to selectively remove the conductive film. Plasma ashing using $O_2$ and wet stripping treatment were subsequently performed to remove the resist and a residue of the etching, to thereby obtain the wiring layer 011. The wiring layer 011 can be formed from, for example, Al, but is not limited to a particular material as long as a conductive material having an electric resistance of $9\times10^{-8}$ Ωm or less is used. For example, gold, silver, or copper may be used to form the wiring layer 011.

The second insulating layer 012 is subsequently formed so as to partially expose the wiring layer 011 (FIG. 4A). The second insulating layer 012 can be formed as follows:

First, an insulating film is formed by chemical vapor deposition (CVD) to have a thickness of approximately 200 nm, and is subsequently processed by photolithography. Specifically, a resist was selectively formed on the insulating film so as to serve as an etching mask, and the insulating film was etched by reactive ion etching (RIE) using $CF_4$. Plasma ashing using $O_2$ and wet stripping treatment were subsequently performed to remove the resist and a residue of the etching, to thereby obtain the second insulating layer 012 is obtained. The second insulating layer 012 can be formed from, for example, SiO. The material of the second insulating layer is not particularly limited as long as the material is an insulative material, and may be SiN or SiCN, for example.

Figure 4B:
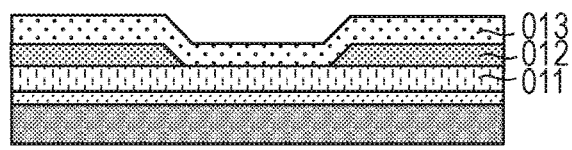

As illustrated in FIG. 4B, the barrier metal layer 013 is formed next on the second insulating layer 012 and the wiring layer 011. The barrier metal layer 013 was formed by sputtering to have a thickness of approximately 200 nm. The material of the barrier metal layer 013 can be, for example, TiW.

Figure 4G:
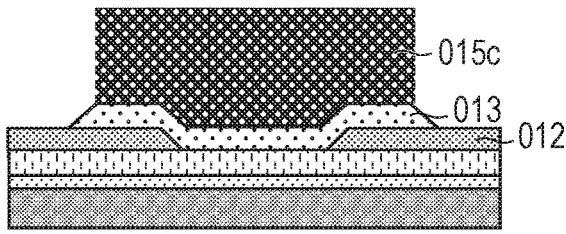
Figure 4C:
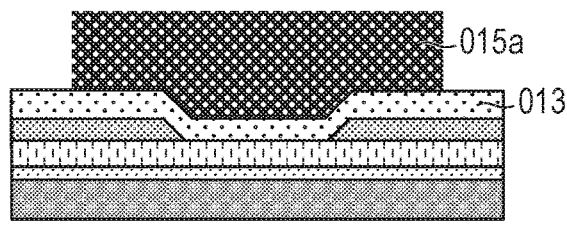

As illustrated in FIG. 4C, a resist mask 015*a* is subsequently formed on the barrier metal layer 013. The resist mask 015*a* was formed as follows:

First, a positive resist was applied by spin coating to have a thickness of approximately 6 μm. A glass mask on which a pattern was selectively drawn was then used to perform i-ray exposure, and development was subsequently performed to dissolve and remove the exposed portion. The positive resist can be, for example, PMER P-LA 300 PM (trade name; manufactured by TOKYO OHKA KOGYO CO., LTD.). The positive resist used in Example 3 is not particularly limited as long as the positive resist is made of a material that can be exposed by i-ray exposure, and THMR-iP-5700 (trade name; manufactured by TOKYO OHKA KOGYO CO., LTD.), for example, can be used. A liquid developer for dissolving the exposed portion of the resist can be NMD-3 (trade name; manufactured by TOKYO OHKA KOGYO CO., LTD.), for example. The liquid developer used in Example 3 is not particularly limited as long as the exposed portion of the resist can be dissolved therewith, and MIBK manufactured by Hayashi Pure Chemical Ind., Ltd., for example, can be used.

Figure 4H:
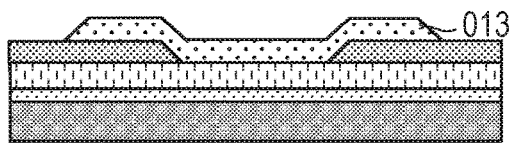
Figure 4D:
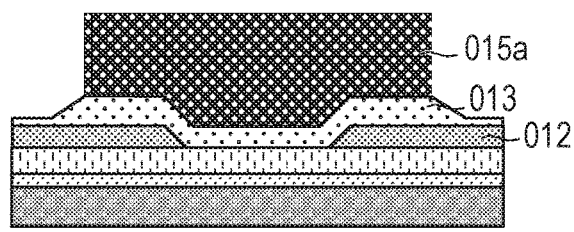

As illustrated in FIG. 4D, most of the barrier metal layer 013 in its thickness direction is removed next by dry etching in opening portions of the resist mask 015*a* so as not to expose the second insulating layer 012.

Here, the dry etching is performed so as not to allow an etchant, which is an ion, a radical, or the like, to reach the second insulating layer 012. The portion of the barrier metal layer 013 removed by the dry etching has a thickness of approximately 150 nm (the etching amount in the thickness direction), and the thickness of the remaining barrier metal layer is approximately 50 nm. In order to shape an edge portion of the barrier metal layer 013 into a forward tapered shape, the portion of the barrier metal layer 013 removed by dry etching is preferred to have a thickness (the etching amount in the thickness direction) greater than 50% of the thickness of the barrier metal layer at the time when the barrier metal layer is formed, and a thickness equal to or greater than 70% of the thickness at the time of forming is even more preferred. An etching gas used in the dry etching can be $CF_4$ gas, but is not particularly limited as long as the barrier metal layer 013 can be removed therewith. For example, a gas that is a mixture of $O_2$ and $N_2$ may be used as the etching gas. Chemical Dry Etching Equipment CDE-80N (trade name; manufactured by SHIBAURA MECHATRONICS CORPORATION), for example, can be used as a dry etching device. With this equipment, isotropic etching using microwave remote plasma is performed.

Figure 4I:
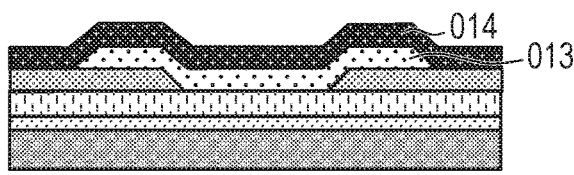
Figure 4E:
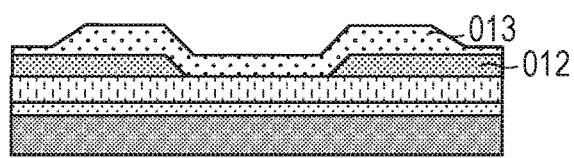

As illustrated in FIG. 4E, the resist mask 015*a* is subsequently removed to expose the entire surface (a surface that is not in contact with the underlying layer) of the barrier metal layer 013. The resist mask 015*a* can be stripped with the use of a stripping solution, for example, Microposit Remover 1112A (trade name; manufactured by Rohm and Haas Electronic Materials LLC). The stripping solution of the resist mask is not particularly limited as long as the unexposed portion (mask) of the positive resist used can be dissolved therewith, and a thinner OK-73 (trade name; manufactured by TOKYO OHKA KOGYO CO., LTD.), for example, can be used.

After the resist mask was stripped, oven baking treatment was performed. The treatment temperature was set to approximately 120° C., and the treatment time was set to 30 minutes. Through such oven baking treatment, moisture left from water washing in the step of stripping the resist mask is evaporated well and a dried state is reached.

As illustrated in FIG. 4F, a resist mask 015*c* is subsequently formed on the barrier metal layer 013.

The resist mask 015*c* is formed so as to have a width dimension smaller than the width dimension (the width in the direction of the substrate plane) of the resist mask 015*a*, which is formed in the step illustrated in FIG. 4C. The resist mask 015*c* is placed inside an area in which the previous resist mask 015*a* has been formed. This exposes a top surface of a portion of the barrier metal layer that retains the thickness of the barrier metal layer at the time when the barrier metal layer is formed (the portion having a thickness of 200 nm), so as to surround the periphery of the resist mask 015*c*. Here, it is preferred to place the peripheral edge of the resist mask 015*c* at least 1 μm inside the peripheral edge of the area in which the resist mask 015*a* has been formed.

The resist mask 015*c* was formed as follows:

First, a positive resist was applied by spin coating to have a thickness of approximately 6 μm. A glass mask on which a pattern was selectively drawn was then used to perform i-ray exposure, and development was subsequently performed to dissolve and remove the exposed portion. The positive resist can be, for example, PMER P-LA 300 PM (trade name; manufactured by TOKYO OHKA KOGYO CO., LTD.). The positive resist used in Example 3 is not particularly limited as long as the positive resist is made of a material that can be exposed by i-ray exposure, and THMR-iP-5700 (trade name; manufactured by TOKYO OHKA KOGYO CO., LTD.), for example, can be used. A liquid developer for dissolving the exposed portion of the resist can be NMD-3 (trade name; manufactured by TOKYO OHKA KOGYO CO., LTD.), for example. The liquid developer used in Example 3 is not particularly limited as long as the exposed portion of the resist can be dissolved therewith, and MIBK manufactured by Hayashi Pure Chemical Ind., Ltd., for example, can be used.

As illustrated in FIG. 4G, the remaining barrier metal layer 013 in the opening portions of the resist mask 015*c* is subsequently removed by wet etching to expose the second insulating layer 012.

Before the wet etching is started (FIG. 4F), 150 nm of the barrier metal layer 013 out of 200 nm, which is the thickness of the barrier metal layer 013 at the time when the barrier metal layer 013 is formed, is removed first by dry etching and the remaining barrier metal layer has a thickness of approximately 50 nm. Because the remaining barrier metal layer is thin as above, the amount of etching required to expose the second insulating layer under the thin portion of the barrier metal layer may be small, and the etching time can accordingly be shortened. The precision of the dimension in the lateral direction (a direction parallel to the substrate) can therefore be maintained. In the wet etching, the thick portion (the portion having a thickness of 200 nm) of the barrier metal layer surrounding the periphery of the resist mask 015c is partially etched, and a forward tapered shape can thus be formed (FIG. 4G).

From the viewpoint of forming such a forward tapered shape, the portion of the barrier metal layer to be removed by the wet etching is preferred to have a thickness (the etching amount in the thickness direction) less than 50% of the thickness of the barrier metal layer at the time when the barrier metal layer is formed, and a thickness equal to or less than 30% of the thickness at the time of forming is even more preferred.

An etchant used in the wet etching can be a hydrogen peroxide solution having a concentration of 31%. The etchant is not limited to a particular temperature or a particular concentration, and a temperature and concentration suitable for the thickness of the film to be removed can be selected.

As illustrated in FIG. 4H, the resist mask 015c is subsequently removed to expose the entire surface (a surface that is not in contact with the underlying layer) of the barrier metal layer 013. Here, the edge portion of the barrier metal layer 013 has a forward tapered shape. The edge portion can have a forward taper angle (the angle of the edge surface of the barrier metal layer with respect to the substrate plane) about less than 60°.

The resist mask 015a can be stripped with the use of a stripping solution, for example, Microposit Remover 1112A (trade name; manufactured by Rohm and Haas Electronic Materials LLC). The stripping solution of the resist mask is not particularly limited as long as the unexposed portion (mask) of the positive resist used can be dissolved therewith, and a thinner OK-73 (trade name; manufactured by TOKYO OHKA KOGYO CO., LTD.), for example, can be used.

After the resist mask was stripped, oven baking treatment was performed. The treatment temperature was set to approximately 120° C., and the treatment time was set to 30 minutes. Through such oven baking treatment, moisture left from water washing in the step of stripping the resist mask is evaporated well and a dried state is reached.

As illustrated in FIG. 4I, the Au layer 014 is subsequently formed so as to cover the entire exposed surface (the surface that is not in contact with the underlying layer) of the barrier metal layer 013. The Au layer 014 is formed by sputtering to have a thickness of approximately 200 nm.

Figure 4J:
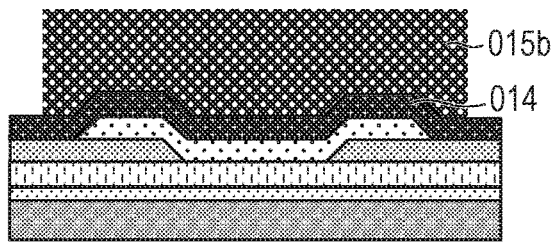

As illustrated in FIG. 4J, a resist mask 015b is subsequently formed on the Au layer 014. The resist mask 015b is formed as follows:

First, a positive resist was applied by spin coating to have a thickness of approximately 6 μm. A glass mask on which a pattern was selectively drawn was then used to perform i-ray exposure, and development was subsequently performed to dissolve and remove the exposed portion.

The positive resist can be, for example, PMER P-LA 300 PM (trade name; manufactured by TOKYO OHKA KOGYO CO., LTD.). The positive resist used in Example 3 is not particularly limited as long as the positive resist is made of a material that can be exposed by i-ray exposure, and THMR-iP-5700 (trade name; manufactured by TOKYO OHKA KOGYO CO., LTD.), for example, can be used. A liquid developer for dissolving the exposed portion of the resist can be NMD-3 (trade name; manufactured by TOKYO OHKA KOGYO CO., LTD.), for example. The liquid developer used in Example 3 is not particularly limited as long as the exposed portion of the resist can be dissolved therewith, and MIBK manufactured by Hayashi Pure Chemical Ind., Ltd., for example, can be used.

Figure 4K:
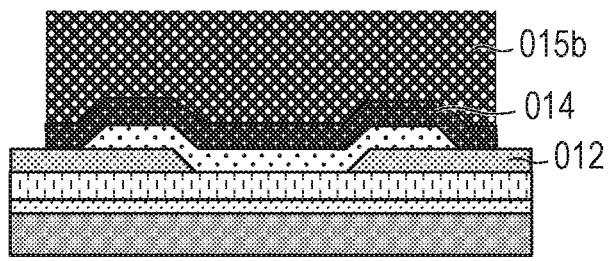

As illustrated in FIG. 4K, etching is subsequently performed with the resist mask 015b as an etching mask, to selectively remove the Au layer 014. The second insulating layer 012 has been exposed at a portion from which the Au layer is removed. In this manner, the Au layer 014 is processed so as to have the shape of an electrode pad. Here, as illustrated in FIG. 2I, the Au layer 014 is processed so as to be greater in width dimension (the dimension in the direction of the substrate plane) than the barrier metal layer. In other words, a lower surface of a peripheral edge portion of the processed Au layer 014 (the electrode pad) is in contact with the top surface of the second insulating layer 012. The Au layer 014 can be processed by wet etching using an iodine-based etchant, for example, AURUM (trade name; manufactured by KANTO CHEMICAL CO., INC.). The etchant used in Example 3 is not particularly limited as long as Au can be etched therewith, and Pure Etch AU (trade name; manufactured by Hayashi Pure Chemical Ind., Ltd.), for example, can be used as an etchant containing iodine.

Figure 4L:
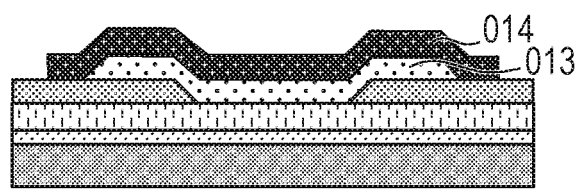

As illustrated in FIG. 4L, the resist mask 015b is subsequently removed to expose the entire surface (the top surface and edge surface) of the Au layer 014. The resist mask 015b can be stripped with the use of, for example, Microposit Remover 1112A (trade name; manufactured by Rohm and Haas Electronic Materials LLC). The stripping solution of the resist mask is not particularly limited as long as the unexposed portion of the resist used can be dissolved therewith, and a thinner OK-73 (trade name; manufactured by TOKYO OHKA KOGYO CO., LTD.), for example, can be used.

After the resist mask was stripped, oven baking treatment was performed. The treatment temperature was set to approximately 120° C., and the treatment time was set to 30 minutes. Through such oven baking treatment, moisture left from water washing in the step of stripping the resist mask is evaporated well and a dried state is reached.

Through the manufacturing process described above, the electrode pad portion of the substrate for a liquid ejection head according to Example 3 of the present invention can be formed. Through the formation of the electrode pad portion in this manner, the corrosion of the barrier metal layer and the wiring layer is suppressed, the precision of the width dimension of the electrode pad portion including the barrier metal layer can be secured, and a highly reliable substrate for a liquid ejection head is consequently provided. Accidental etching of the insulating layer immediately under the barrier metal layer can be prevented when the barrier metal layer is etched. In Example 3, the precision of the width dimension of the electrode pad portion including the barrier metal layer is secured at a central value ±1.0 μm.

Comparative examples are presented next to describe a method of manufacturing a substrate for a liquid ejection head of the related art and problems of the methods.

Comparative Example 1

A laminate substrate on which the wiring layer 011 and the second insulating layer 012 are formed is formed in the same manner as in the step described in Example 1 with reference to FIG. 2A.

Figure 5A:
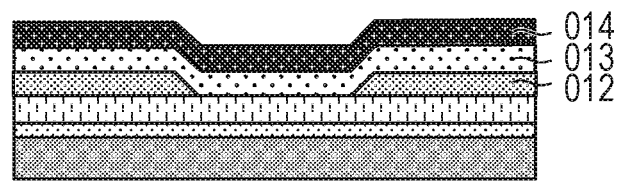
FIG. 5A, FIG. 5B, and FIG. 5C are sectional views for illustrating steps of a method of manufacturing a substrate for a liquid ejection head of Comparative Example 1.

Next, the barrier metal layer 013 and the Au layer 014 are formed in order on the wiring layer 011 and the second insulating layer 012 as illustrated in FIG. 5A. The barrier metal layer 013 can be formed in the same manner as in the barrier metal layer forming in the step described in Example 1 with reference to FIG. 2B. The Au layer 014 can be formed in the same manner as in the Au layer forming in the step described in Example 1 with reference to FIG. 2G.

Next, a resist mask is formed on the Au layer 014, and wet etching is performed on the Au layer 014 and the barrier metal layer 013 to pattern the layers into the shape of an electrode pad.

Figure 5B:
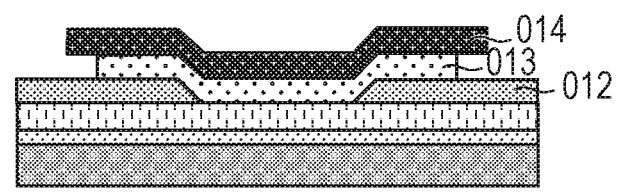

After the Au layer 014 is etched, however, side etching progresses in the etching of the barrier metal layer 013 as illustrated in FIG. 5B. An edge portion of the Au layer 014 consequently protrudes farther than an edge portion of the barrier metal layer 013. In addition, the edge portion of the barrier metal layer 013 is exposed.

Figure 5C:
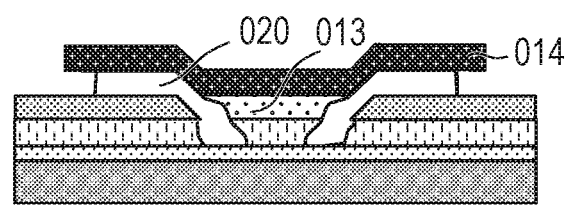

As illustrated in FIG. 5C, the process of manufacturing a liquid ejection head is conducted, and then dissolution by a chemical progresses from the edge portion of the barrier metal layer 013. The chemical is an alkaline resist stripping solution, for example, EKC 2255 (trade name; manufactured by E. I. du Pont de Nemours and Company). A portion of the wiring layer 011 that is in contact with the barrier metal layer 013 dissolves as well, and a gap 020 due to corrosion reaches the wiring layer 011. As described above, the technology of Comparative Example 1 does not allow the Au layer to cover the barrier metal layer well, and accordingly suffers troubles of an electrode pad due to the corrosion.

Comparative Example 2

A laminate substrate on which the wiring layer 011 and the second insulating layer 012 are formed is formed in the same manner as in the step described in Example 1 with reference to FIG. 2A.

Next, the barrier metal layer 013 is formed on the wiring layer 011 and the second insulating layer 012 in the same manner as in the step illustrated in FIG. 2B.

Figure 6A:
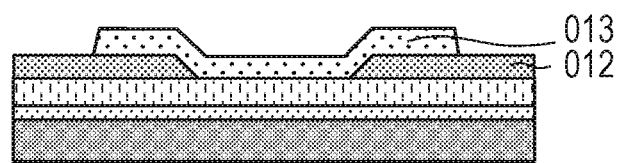
FIG. 6A, FIG. 6B, and FIG. 6C are sectional views for illustrating steps of a method of manufacturing a substrate for a liquid ejection head of Comparative Example 2.

As illustrated in FIG. 6A, the barrier metal layer 013 is subsequently patterned on the second insulating layer 012. The barrier metal layer 013 is patterned by forming a resist mask on the barrier metal layer 013 and then performing wet etching. The patterning is performed so that the second insulating layer 012 is exposed at opening portions of the resist mask. In this case, an edge portion of the barrier metal layer 013 does not have a forward tapered shape of a satisfactory taper angle, and the measured taper angle is from 70° to 80°.

Figure 6B:
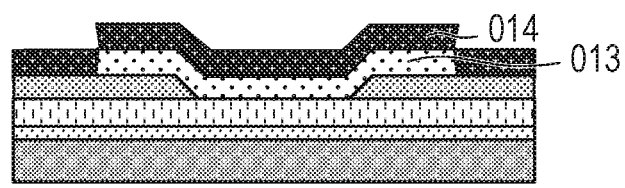

As illustrated in FIG. 6B, the Au layer 014 is subsequently formed on the barrier metal layer 013. The edge portion of the barrier metal layer 013 cannot be covered well with the Au layer 014, and a slight gap is consequently created.

Figure 6C:
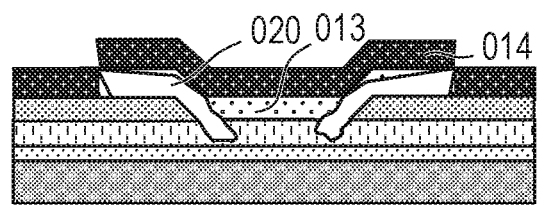

As illustrated in FIG. 6C, the process of manufacturing a liquid ejection head is conducted, and then a chemical infiltrates from the gap in the Au layer 014 near the edge portion of the barrier metal layer 013, and the dissolution of the barrier metal layer 013 progresses. A portion of the wiring layer 011 that is in contact with the barrier metal layer 013 dissolves as well, and the gap 020 due to corrosion reaches the wiring layer 011. As described above, the technology of Comparative Example 2 does not allow the Au layer to cover the barrier metal layer well, and accordingly suffers troubles of an electrode pad due to the corrosion.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-034970, filed Feb. 28, 2018, which is hereby incorporated by reference herein in its entirety.

What is claimed is:

1. A method of manufacturing a substrate for a liquid ejection head, the substrate including a wiring layer, an insulating layer on the wiring layer, a barrier metal layer on the wiring layer and the insulating layer, and an electrode layer on the barrier metal layer, the electrode layer being electrically connected to the wiring layer through intermediation of the barrier metal layer, the method comprising:
   forming the barrier metal layer on the wiring layer and on the insulating layer;
   forming a resist mask on the barrier metal layer;
   performing dry etching on a first portion of the barrier metal layer, which is exposed from an opening portion of the resist mask, so that the dry etching is prevented from reaching the insulating layer;
   performing wet etching on a second portion of the barrier metal layer exposed by the dry etching so that the wet etching reaches the insulating layer;
   stripping the resist mask; and
   forming the electrode layer on a third portion of the barrier metal layer that remains after the wet etching.

2. The method according to claim 1, wherein an etching amount of the barrier metal layer etched by the dry etching in a thickness direction of the barrier metal layer is larger than an etching amount of the barrier metal layer etched by the wet etching in the thickness direction of the barrier metal layer.

3. The method according to claim 1, wherein, in the first portion of the barrier metal layer, 70% or more of a thickness of the barrier metal layer is etched by the dry etching, and
   wherein, in the second portion of the barrier metal layer, a remaining 30% or less of the thickness of the barrier metal layer is etched by the wet etching.

4. The method according to claim 1, wherein the electrode layer is formed so that a peripheral edge portion of the barrier metal layer is covered.

5. The method according to claim 1, wherein a peripheral edge portion of the barrier metal layer is formed into a tapered shape, and the electrode layer is formed so that the peripheral edge portion of the barrier metal layer having the tapered shape is covered.

6. The method according to claim 5, wherein a taper angle of the tapered shape of the peripheral edge portion of the barrier metal layer is from 30° to less than 70°.

7. The method according to claim 1, wherein the electrode layer is formed so that the electrode layer is in contact with a top surface of a portion of the insulating layer that is on a periphery of the barrier metal layer.

8. The method according to claim 7, further comprising processing the electrode layer to form an electrode pad,
   wherein the electrode pad is configured to cover a peripheral edge portion of the barrier metal layer, and is in contact with the top surface of the portion of the insulating layer that is on the periphery of the barrier metal layer.

9. The method according to claim 1, wherein the electrode layer is an Au layer.

10. The method according to claim 1, wherein the barrier metal layer includes TiW.

* * * * *